(12) United States Patent
Rottenberg et al.

(10) Patent No.: US 10,211,809 B2
(45) Date of Patent: Feb. 19, 2019

(54) DEVICES AND METHODS FOR GENERATION AND DETECTION OF SPIN WAVES

(71) Applicant: IMEC VZW, Leuven (BE)

(72) Inventors: Xavier Rottenberg, Kessel-Lo (BE); Christoph Adelmann, Wilsele (BE)

(73) Assignee: IMEC vzw, Leuven (BE)

( * ) Notice: Subject to any disclaimer, the term of this patent is extended or adjusted under 35 U.S.C. 154(b) by 185 days.

(21) Appl. No.: 15/143,228

(22) Filed: Apr. 29, 2016

(65) Prior Publication Data
US 2016/0322955 A1   Nov. 3, 2016

(30) Foreign Application Priority Data

Apr. 30, 2015   (EP) ..................................... 15165984

(51) Int. Cl.
*G01B 7/14* (2006.01)
*H03H 9/22* (2006.01)
(Continued)

(52) U.S. Cl.
CPC .................. *H03H 9/22* (2013.01); *G01B 7/24* (2013.01); *G01R 33/1284* (2013.01);
(Continued)

(58) Field of Classification Search
CPC ........ G01R 33/00; G01R 33/02; G01R 33/18; G01R 33/1284; G01N 29/12; G01N 29/14; G01N 29/28; G01N 29/245
See application file for complete search history.

(56) References Cited

U.S. PATENT DOCUMENTS 4,999,609 A * 3/1991 Crossfield .......... G08B 13/2425
340/551
6,297,579 B1 * 10/2001 Martin .................. H01L 41/257
310/330
(Continued)

FOREIGN PATENT DOCUMENTS

WO   WO 2007/037625 A1   4/2007
WO   WO 2014/138376 A1   9/2014

OTHER PUBLICATIONS

Cherepov et al., "Electric-field-induced spin wave generation using multiferroic magnetoelectric cells," Applied Physics Letters, 2014, 082403-1-082403-5, vol. 104, AIP Publishing LLC.
(Continued)

*Primary Examiner* — Minh N Tang
(74) *Attorney, Agent, or Firm* — Knobbe, Martens, Olson & Bear LLP

(57) ABSTRACT

The disclosed technology generally relates to semiconductor devices, and more particularly to a device configured as one or both of a spin wave generator or a spin wave detector. In one aspect, the device includes a magnetostrictive film and a deformation film physically connected to the magnetorestrictive film. The device also includes an acoustic isolation surrounding the magnetostrictive film and the deformation film to form an acoustic resonator. When the device is configured as the spin wave generator, the deformation film is configured to undergo a change physical dimensions in response to an actuation, where the change in the physical dimensions of the deformation film induces a mechanical stress in the magnetostrictive film to cause a change in the magnetization of the magnetostrictive film. When the device is configured as the spin wave detector, the magnetostrictive film is configured to undergo to a change in physical dimensions in response to a change in magnetization, wherein the change in the physical dimensions of the
(Continued)

magnetostrictive film induces a mechanical stress in the deformation film to cause generation of electrical power by the deformation film.

20 Claims, 3 Drawing Sheets

(51) Int. Cl.
H01L 41/00 (2013.01)
H01L 41/12 (2006.01)
G01B 7/24 (2006.01)
G01R 33/12 (2006.01)
H03H 9/17 (2006.01)
H03H 9/24 (2006.01)
G01R 33/18 (2006.01)
H03B 15/00 (2006.01)
H01F 10/12 (2006.01)
H01F 10/14 (2006.01)
B82Y 25/00 (2011.01)

(52) U.S. Cl.
CPC ............ *G01R 33/18* (2013.01); *H01F 10/126* (2013.01); *H01F 10/14* (2013.01); *H01L 41/00* (2013.01); *H01L 41/12* (2013.01); *H03B 15/006* (2013.01); *H03H 9/171* (2013.01); *H03H 9/24* (2013.01); *B82Y 25/00* (2013.01)

(56) References Cited

U.S. PATENT DOCUMENTS

| 6,809,516 B1* | 10/2004 | Li | G01R 15/20 |
| | | | 324/244 |
| 2005/0174014 A1 | 8/2005 | Korden et al. | |
| 2015/0082888 A1* | 3/2015 | Otsu | G01N 29/12 |
| | | | 73/587 |
| 2016/0003924 A1* | 1/2016 | Sun | G01R 33/093 |
| | | | 324/322 |

OTHER PUBLICATIONS

Khitun et al., "Non-volatile magnonic logic circuits engineering," Journal of Applied Physics, 2011, 034306-1-034306-11, vol. 10, American Institute of Physics.

Kiseki et al., "Efficient excitation and detection of standing spin wave in Permalloy film: Demonstration of spin wave resonator," Applied Physics Letters, 2012, 2012404-1-2012404-4, vol. 101, American Institute of Physics.

Extended European Search Report for EP Application No. 15165984.4 dated Nov. 17, 2015.

* cited by examiner

DEVICES AND METHODS FOR GENERATION AND DETECTION OF SPIN WAVES

CROSS-REFERENCE TO RELATED APPLICATIONS

This application claims foreign priority to European Patent Application EP 15165984.4, filed Apr. 30, 2015, the content of which is incorporated by reference herein in its entirety.

BACKGROUND

Field

The disclosed technology generally relates to semiconductor devices, and more particularly to a device configured to generate and/or detect spin waves.

Description of the Related Technology

With the ongoing technological advances, there is a constant desire to increase the speed and processing power of transistor-based computational architectures. For the past 40 years, miniturization, or scaling, of field-effect transistors and integrated circuits has provided ever-increasing transistor performance and density, following the famed Moore's law, which predicts that the computational power doubles roughly about every 18 months.

To continue the scaling or miniturization in the next decade(s), an extensive international research effort is currently being undertaken, with a strong focus on replacing Si-based field-effect transistors with devices with similar or identical functionality with improved performance.

It is, however, widely acknowledged in the semiconductor community that the miniturization of conventional devices, such as complementary metal oxide semiconductor (CMOS) transistors is becoming increasingly challenging, and for many applications, there is an increasing need for alternative device structures. The difficulty in scaling devices such as CMOS transistors arises from several concurrent fundamental and practical limits related to their operation and manufacturability. For example, one limitation is the increase of the dissipation power, which has emerged as one of the main challenges hampering further improvement. Hence, there is a need to limit thermal dissipation, which becomes critical when scaling down feature sizes of a transistor, e.g., the gate length of a transistor, to the nanometer regime. In the nanometer regime, among other effects, quantum mechanical effects, can drastically increase leakage currents.

The utilization of electron spin for information encoding and information transmission offers an attractive solution. Spintronics is an emerging new approach to electronics, where the information is carried out by the spin of the carrier, in addition to the charge.

To this end, spin wave-based logic and signal processing devices may further be used to replace conventional charge-based microelectronic circuits. For spin waves, phase and amplitude may be controlled by gating it with local electrical and magnetic fields. Unlike some traditional devices such as field-effect transistors that utilize movement of charge carriers (e.g., electrons and/or holes), using spin waves to compute does not require moving charge. The wave properties of the spin waves, such as their ability to interfere, may further be used to efficiently perform logical operations. In addition, unlike some devices utilizing optical computing, spin wave wavelengths are not limited to the wavelength of light. For these reasons, among other reasons, spin wave-based devices may be better adapted for scaling to the nanometer scale.

A successful realisation of spin wave circuits depends, however, crucially on the efficiency by which spin waves may be generated or detected.

SUMMARY OF CERTAIN INVENTIVE ASPECTS

It is an object of the disclosed technology to improve the above techniques and the prior art. In particular, it is an object to provide improved devices for generating and detecting spin waves respectively. Further, methods for generating and detecting spin waves using the provided devices are also provided.

According to one aspect of the disclosure, a device includes a magnetostrictive film and a deformation film physically connected to the magnetostrictive film. The device also includes an acoustic isolation surrounding the magnetostrictive film and the deformation film to form an acoustic resonator. When the device is configured as a spin wave generator, the deformation film is configured to undergo a change physical dimensions in response to an actuation, where the change in the physical dimensions of the deformation film induces a mechanical stress in the magnetostrictive film to cause a change in the magnetization of the magnetostrictive film. When the device is configured as a spin wave detector, the magnetostrictive film is configured to undergo to a change in physical dimensions in response to a change in magnetization, wherein the change in the physical dimensions of the magnetostrictive film induces a mechanical stress in the deformation film to cause generation of electrical power by the deformation film.

According to another aspect of the disclosure, the above is at least partly alleviated by a device for generating spin waves, the device comprising: a magnetostrictive film, a deformation film changing physical dimensions in response to an actuation, and an acoustic isolation, the magnetostrictive film and the deformation film being connected, such that a change in physical dimensions of the deformation film results in a mechanical stress in the magnetostrictive film resulting in a change in magnetization of the magnetostrictive film, the acoustic isolation surrounding the magnetostrictive film and the deformation film, thereby forming an acoustic resonator.

By means of the device it is possible to generate spin waves by providing an actuation to the deformation film. The deformation film will thereby change its physical dimensions in response to the actuation. The change in physical dimensions of the deformation film will result in that a mechanical stress is induced in the magnetostrictive film as the deformation film and the magnetostrictive films are connected to each other. In other words, the deformation film and the magnetostrictive films are mechanically coupled to each other, such that a change in physical dimensions of the deformation film will result in that the magnetostrictive film is affected and a mechanical stress is induced in the magnetostrictive film. When the magnetostrictive film is subjected to the mechanical stress it will as a result of the mechanical stress change its magnetization. A change in magnetization may in turn result in that a spin wave is generated by the magnetostrictive film. To enhance the efficiency of the device, the deformation film and the magnetostrictive film are surrounded by an acoustic isolation such that an acoustic resonator is formed.

According to another aspect of the disclosure, the above is at least partly alleviated by a device for detecting spin waves, the device comprising: a magnetostrictive film changing physical dimensions in response to a change in magnetization, a deformation film, and an acoustic isolation, the magnetostrictive film and the deformation film being connected, such that a change in physical dimensions of the magnetostrictive film results in a mechanical stress in the deformation film resulting in that an electrical power is generated by the deformation film, the acoustic isolation surrounding the magnetostrictive film and the deformation film, thereby forming an acoustic resonator.

By means of the device it is possible to detect spin waves by sensing a change in physical dimensions of the magnetostrictive film induced by a change in magnetization, e.g. originating from spin waves affecting the magnetostrictive film. In other words, when the magnetostrictive film is subjected to a change in magnetization it will change its physical dimensions. The change in physical dimensions of the magnetostrictive film will result in that a mechanical stress is induced in the deformation film as the deformation film and the magnetostrictive films are connected to each other. In other words, the deformation film and the magnetostrictive films are mechanically coupled to each other, such that a change in physical dimensions of the magnetostrictive film will result in that the deformation film is affected and a mechanical stress is induced in the deformation film. When the deformation film is subjected to the mechanical stress it will as a result of the mechanical stress generate an electrical power. The electrical power so produced is thus pertaining to the change of magnetization of the magnetostrictive film. To enhance the efficiency of the device, the deformation film and the magnetostrictive films are surrounded by an acoustic isolation such that an acoustic resonator is formed.

It should be noted that the above-disclosed devices for producing and/or detecting spin waves may generally be of the same or similar type. This means that the mode of operation may determine whether the device concerned may be used to generate spin waves or may be used to detect spin waves.

It should be noted that within the context of this application, the term "change in physical dimensions" may refer to any dimensional change, i.e. any change when the actual geometry of the deformation film and/or magnetostrictive film is changed.

It should be noted that within the context of this application, the term "surrounding" may be used to describe the deformation film and/or the magnetostrictive film that are partially or completely surrounded by the acoustic isolation. In other words, all or some of the external sides or surfaces of the respective films may be covered by or arranged adjacent to the acoustic isolation. Other objects such as electrodes may be arranged between the respective films and the acoustic isolation. This implies further that there may be one or a plurality of openings in the acoustic isolation. The openings provided in the acoustic isolation may for instance be used for introducing wires, a waveguide or similar features.

In some embodiments the devices described above may further comprise a spin waveguide for propagation of spin waves, which is advantageous in that spin waves may be led to and from the magnetostrictive film of the respective devices in an efficient manner.

In some embodiments the spin waveguide may be integrally formed with the magnetostrictive films of the respective devices or may be formed as a separate ferromagnetic element connected to the magnetostrictive films of the respective devices. By these arrangements the fabrication of the wave guide and consequently the devices may be adapted to suit the application in which the devices are to be used.

In some embodiments, the devices described above may further comprise an electrode arranged within the acoustic isolation and in contact with the deformation film. By this arrangement, an electrical power may be led to the deformation film or an electrical power generated in the deformation film may be sensed.

In some embodiments the deformation films of the devices described above may comprise a piezoelectric material, which is advantageous in that well established techniques may be used to when generating and detecting spin waves in the respective devices.

In some embodiments, the deformation films of the devices described above may comprise an electro-active material or an opto-thermally active material. By these arrangements, the device for generating spin waves may be actuated by feeding electrical power to the electro-active material or by feeding light to the opto-thermally active material depending on which material is used. When using an opto-thermally active material light may be fed to the opto-thermally active material by illuminating the opto-thermally active material. Further, the device for detecting spin waves may be operated by sensing an electrical power generated in the deformation film when using an electro-active material.

In some embodiments, the acoustic isolation of the devices described above may comprise an acoustic reflector. The acoustic reflector comprises one or more of: an acoustic Bragg mirror structure, a material having an acoustic band gap, an air gap, a vacuum gap or a difference in acoustic impedance. By these arrangements, leakage of wave energy from within the acoustic isolation may be reduced, resulting in that a standing wave may be generated within the acoustic resonator in an efficient manner. The use of a standing wave within the acoustic resonator may further improve the efficiency of the respective above devices. Moreover, higher order harmonics may also result in standing waves within the acoustic resonator.

In some embodiments, the magnetostrictive material of the respective above devices may comprise one or more of: Terfenol-D ($Tb_xDy_{1-x}Fe_2$); Galfenol ($Ga_xFe_{1-x}$); Co; Ni; and a Heusler alloy. These embodiments can be advantageous because well-known and easily available materials may be used in the respective magnetostrictive films.

In some embodiments, the piezoelectric material of the respective above devices may comprise one or more of: $PbZrTiO_3$ (PZT); $PbMgNbO_x$—$PbTiO_x$ (PMN-PT); $BaTiO_3$ (BTO); $SrBiTaOx$, (SBT); AlN; GaN; $LiNbO_3$, LNO; ZnO; $(K,Na)NbO_x$, KNN; and orthorhombic $HfO_2$. These embodiments may be advantageous because well-known and easily available materials may be used in the respective deformation films.

According to another aspect of the disclosure, there is provided a method for generating spin waves using a device of the above kind for generating spin waves, the method comprising the steps of: providing an alternating actuation to the deformation film to change physical dimensions of the deformation film, the alternating actuation having a frequency arranged to excite a resonance of the acoustic resonator, thereby creating a standing acoustic wave within the acoustic isolation, the standing wave inducing a mechanical stress in the magnetostrictive film resulting in a change in magnetization of the magnetostrictive film, such that a spin wave is generated in the magnetostrictive film.

In general, features of this aspect of the disclosure provide similar advantages as discussed above in relation to the previous aspects of the disclosure.

In some embodiments, the frequency of the alternating actuation may be between 1 GHz and 100 GHz.

In some embodiments, the alternating actuation may be an alternating electrical power.

In some embodiments, the alternating actuation may be light beam alternating in intensity.

According to another aspect of the disclosure, there is provided a method for detecting spin waves using a device of the above kind for detecting spin waves, the method comprising the steps of: receiving a spin wave in the magnetostrictive film, the spin wave resulting in a change of magnetization of the magnetostrictive film, thereby changing the physical dimensions of the magnetostrictive film, resulting in a mechanical stress in the deformation film such that an electrical power is generated in the deformation film.

In general, features of this aspect of the disclosure provide similar advantages as discussed above in relation to the previous aspects of the disclosure.

BRIEF DESCRIPTION OF THE DRAWINGS

Embodiments of the present disclosure will now be described, by way of example, with reference to the accompanying schematic drawings, in which.

DETAILED DESCRIPTION OF CERTAIN ILLUSTRATIVE EMBODIMENTS

The disclosed technology will now be described more fully hereinafter with reference to the accompanying drawings, in which currently preferred embodiments of the disclosure are shown. This disclosure may, however, be embodied in many different forms and should not be construed as limited to the embodiments set forth herein. These embodiments are rather provided for thoroughness and completeness, and for fully conveying the scope of the disclosure to the skilled person.

Figure 5:
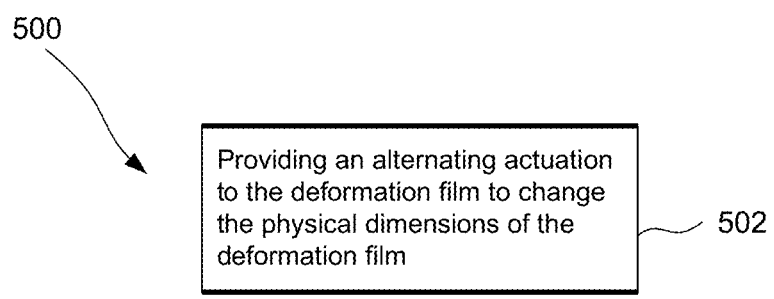
FIG. 5 illustrates a method for generating spin waves, according to embodiments.

In the following a device 100 for generating and/or detecting spin waves will be described with reference to FIG. 1. A method 500 for generating spin waves using the device 100 will further be described with reference to FIG. 5.

As used herein, the magnetorestriction refers to a property of materials, e.g., ferromagnetic materials, which causes the shape and/or dimensions the materials to change during, or as a result of, magnetization.

Figure 1:
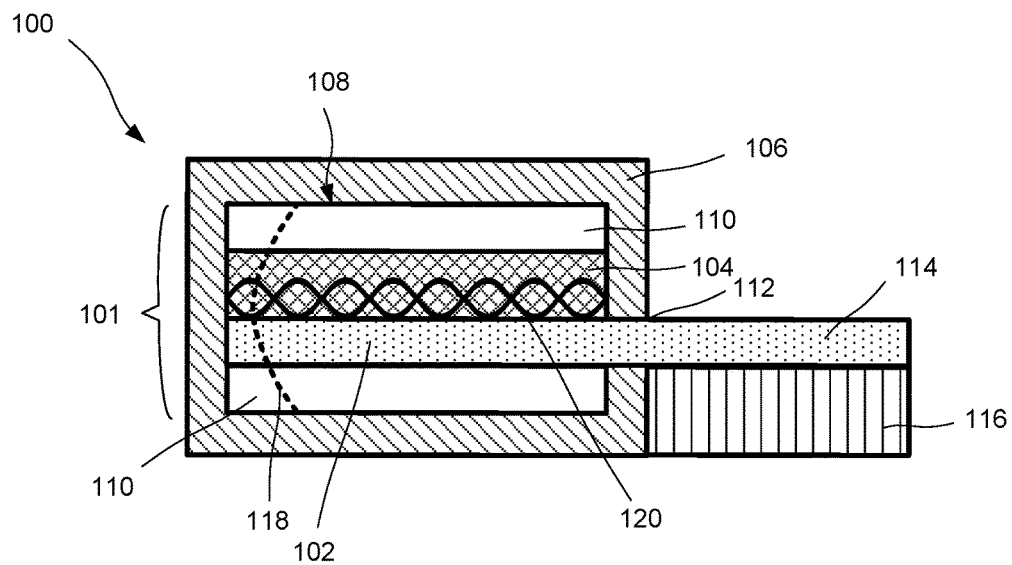
FIG. 1 illustrates a schematic cross-sectional view of a device for generating and/or detecting spin waves, according to embodiments.

FIG. 1 schematically illustrates a cross-sectional view of a device 100 configured for generating spin waves, according to embodiments. The device 100 comprises a stack of layers 101 comprising a magnetostrictive film 102 and a deformation film 104. The magnetostrictive film 102 is arranged on top of, e.g., in mechanical contact with, a deformation film 104. An acoustic isolation 106 surrounds the magnetostrictive film 102 and the deformation film 104, such that an acoustic resonator 108 is formed, as will be described below. Electrodes 110 are further arranged within the acoustic isolation 106. The electrodes 110 also form part of the stack of layers 101. The electrodes 110 are formed on, e.g., in contact with, the deformation film 104 and the magnetostrictive film 102, respectively.

The magnetostrictive film 102 comprises Terfenol-D, which has a chemical formula $Tb_xDy_{1-x}Fe_2$ which is a ferromagnetic material that reversibly changes its shape or dimensions in response to a change in magnetization or, conversely, reversibly changes its magnetization in response to a mechanical stress.

The deformation film 104 comprises a piezoelectric material such as $PbZrTiO_3$ (PZT). Piezoelectricity is the electric charge that is accumulated in a piezoelectric material in response to applied mechanical stress. It should be noted that the piezoelectric effect is also a reversible effect such that a piezoelectric material exhibits mechanical stress as a result of an applied electrical field.

A method 500 for generating a spin wave utilizing the device 100 will now be described, according to embodiments. The method 500 takes advantage of the magnetostrictive properties of the magnetostrictive film 102 and the piezoelectric properties of the deformation film 104, and their mechanical interaction. It should be noted that the magnetostrictive film 102 and the deformation film 104 are in direct physical contact in the embodiment depicted in FIG. 1. Additional layers or films may, however, be arranged or partially arranged in between the magnetostrictive film 102 and the deformation film 104.

The method 500 comprises providing 502 an alternating actuation to the deformation film 104 to change the physical dimensions of the deformation film 104. The alternating actuation is applied by varying an electrical voltage applied to the electrodes 110. In response to the actuation, the deformation film 104 changes its dimensions, whereby the magnetostrictive film 102 experiences a mechanical stress. The mechanical stress changes the susceptibility of the magnetostrictive film 102, i.e. a change in magnetization of the magnetostrictive film 102.

In other words, without being bound to any theory, the alternating electrical voltage applied across the piezoelectric material of the deformation film 104 rearranges the internal structure of the piezoelectric material, such that the volume of the deformation film 104 is changed. The change in volume produces stress in the adjacent magnetostrictive film 102. The stress affects the magnetostrictive material of the magnetostrictive film 102 resulting in a change of magnetization of the magnetostrictive film 102. This change of magnetization may induce a spin wave as will be described below.

Figure 6:
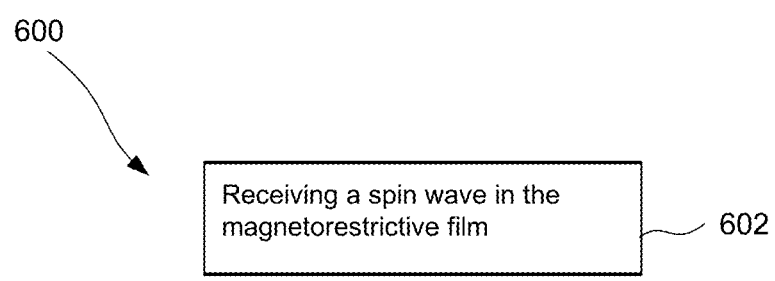
FIG. 6 illustrates a method for detecting spin waves, according to embodiments.

It should be noted that the device 100 can be alternatively or additionally be configured to detect spin waves. Hence, a method 600 for detecting spin waves using the device 100 is also provided, as illustrated in FIG. 6. The method 600 comprises the step of receiving 602 a spin wave in the magnetostrictive film 102. The spin wave so received changes the magnetization of the magnetostrictive film 102, thereby changing the physical dimensions of the magnetostrictive film 102. The change in physical dimensions of the magnetostrictive film 102 influences the adjacent deformation film 104 whereby a mechanical stress is induced in the deformation film 104 and an electrical power is generated in the deformation film 104. In other words, a change in magnetic field within the magnetostrictive material produces stress in the magnetostrictive film 102 which affects the piezoelectric material whereby its electric polarization is changed such that a voltage is provided at the electrodes 110.

Thus, a link between magnetization and electric field is provided by the device 100 allowing for effective generation and/or detection of spin waves.

In the illustrated embodiment of FIG. 1, the magnetostrictive film 102 extends through an opening 112 in the acoustic isolator 106. The magnetostrictive film 102 may thereby form an efficient spin waveguide 114 allowing for spin waves to propagate via the magnetostrictive film 102 before/after they are detected/generated by the device 100. The spin wave guide 114 is integrally formed with the magnetostrictive film 102 in the depicted embodiment. However, other arrangements are possible, as described below with respect to FIG. 2. The spin waveguide 114 is supported on a support 116 for increased stability. The device 100 allows for efficient transmission of changes to the magnetic moments of the magnetostrictive film 102. Efficient conversion of spin waves to electric pulses or vice versa may thereby be achieved by the device 100.

Figure 2:
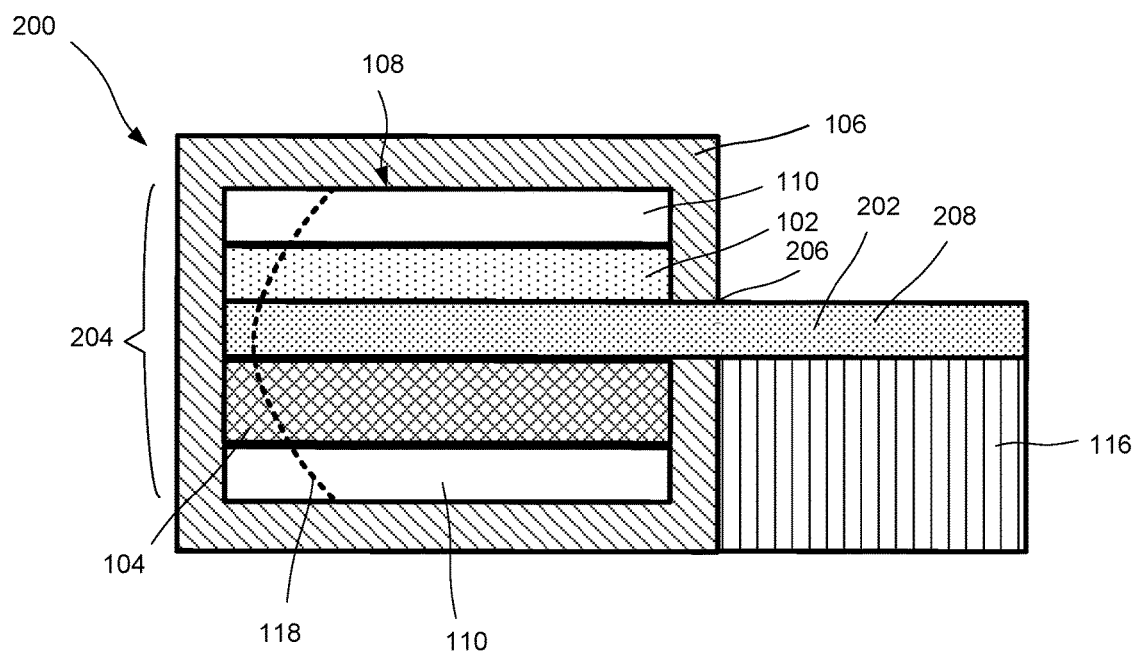
FIG. 2 illustrates a schematic cross-sectional view of another device for generating and/or detecting spin waves, according to embodiments.

A device 200 for generating and detecting spin waves may comprise a separate ferromagnetic element 202, as schematically illustrated in FIG. 2, according to embodiments. The separate ferromagnetic element 202 forms a part of the stack of layers 204 of the device 200. The separate ferromagnetic element 202 extends through an opening 206 formed in the acoustic isolator 106 of the device 200 and forms the spin waveguide 208 for propagation of spin waves to and from the device 200.

Alternatively, the separate ferromagnetic element may be a separate ferromagnetic element connected to the magnetostrictive film 102.

The separate ferromagnetic element may be formed as a layer.

In various embodiments, the separate ferromagnetic element may comprise a magnetic material such as $Y_3Fe_5O_{12}$ (YIG); and CoFe or NiFe. Integration of the devices for generating and detecting spin waves to external circuitry may be simplified by using a separate ferromagnetic element.

To enhance the efficiency of the devices 100 and 200, the deformation films 104 and the magnetostrictive films 102 are surrounded by the respective acoustic isolations 106, in various embodiments. The acoustic isolations 106 form acoustic resonators 108. More specifically, an acoustic resonance condition for the materials within in the acoustic isolator 106 may be met when an alternating actuation is applied to the deformation film 104 having a driving frequency which is corresponding to a resonance frequency of the acoustic resonator 108. The acoustic resonator 108 may thereby be excited, leading to an increased vibration amplitude within the acoustic isolation 106. An increased vibrational amplitude may induce a greater change of the physical dimensions of the magnetostrictive film 102 and/or the deformation film 104.

The devices 100 and 200, with their acoustic resonators 108, may be understood as mechanical resonators also referred to as thin film bulk acoustic resonators, FBARs. The devices 100 and 200 are scalable. The dimensions of the devices may typically be about 100 nm×100 nm (length× width), with film thicknesses of about 10-100 nm. The thicknesses of the stack of layers 101 are then on the order of about 100 nm. Generally, the lateral dimensions of the respective acoustic isolators are below 200 nm and the total height of the respective acoustic isolators is between about 10 nm and about 1 µm.

Hence, the resonance frequencies of these structures are, generally, in the range of 1 GHz to 100 GHz and typically about 10 GHz. These frequencies are suitable to, via the vibrations of the magnetostrictive film 102, interact with spin waves which have wavelengths on the order of 100 nm and below. To this end, frequencies used for the alternating actuation are preferably to match these resonance frequencies as will be described next.

By said frequencies, standing acoustic waves 118, schematically illustrated by the dashed lines in FIGS. 1 and 2, may be obtained in the materials inside the respective acoustic isolations 106. The standing waves 118, also referred to as stationary waves, should be understood as a wave in a medium, i.e. within the materials within the acoustic isolation 106, for which each point on the axis of the wave has constant amplitude. The locations at which the amplitudes of the wave are at minima are called nodes, and the locations where the amplitudes are at maxima are called antinodes. By proper selection of the frequency of the alternating actuation, the locations of the nodes may be changed within the acoustic isolation 106 such that an increased amplitude, i.e. formed antinodes, may be generated at desired location within the respective stack of layers 101, 204. A specific alternating actuation may thereby induce an increased mechanical stress in the respective magnetostrictive films 102 resulting in a more efficient change in the magnetization of the respective magnetostrictive films 102. Hence, a spin wave may more efficiently be generated in the respective magnetostrictive films 102 and more efficient devices 100, 200 for generating spin waves may be obtained.

Again referring to FIG. 1, an additional lateral resonant mode 120 is schematically illustrated with solid lines. The additional lateral resonant mode 120 is exemplified by a standing wave of a higher order. The additional lateral resonant mode 120 may be obtained by an alternating actuation. The frequency of the mode 120 may be made to match the wavelength of a spin wave in the magnetostrictive film 102, typically of order of 100 nm or below. The additional lateral resonant mode 120 may, in other words, induce an increased vibrational amplitude in the magnetostrictive film 102 matching the wavelength of a spin wave. Hence an efficient interaction between the magnetostrictive film 102 and the spin wave may be obtained. The skilled person in the art realises that the additional lateral resonant mode may be of a different order.

Similarly, more efficient devices 100, 200 for detecting spin waves may be achieved by the acoustic isolations 106 forming acoustic resonators 108. More specifically, the spin wave may induce stress in the magnetostrictive film 102 at a frequency given by the oscillation of the spin wave. As a result, the physical dimensions of the magnetostrictive film 102 is changed which in turn induces a mechanical stress in the respective deformation films 104 at a given frequency. The size and material composition of the acoustic resonator 108 may be designed to have a resonance frequency matching the frequency at which the deformation film 104 and/or magnetostrictive film 102 oscillates, whereby a standing wave 118 within the acoustic isolator 106 may be obtained.

An increased oscillation amplitude may be obtained and a larger electrical power may be generated by the deformation film 104.

To form an efficient acoustic resonator 108, the acoustic isolation 106 may have an acoustic impedance that differs from that of the materials within the stack of layers 101, according to embodiments. Hence, the acoustic isolation 106 forms an acoustic interface to the environment surrounding of the device 100. The acoustic impedance should be understood as a measure of the resistance that the acoustic isolation 106 achieves to an acoustic wave. The pressure amplitudes of the reflected and transmitted acoustic waves at an interface between two media are determined by the impedance ratio of the two media. The process of wave reflection may be defined as the return of all or part of an acoustic wave when it encounters the boundary between two media. The larger impedance ratio at the interface between two media the larger is the reflection. Hence, by proper selection of the dimensions of and materials within the respective acoustic isolations reflected acoustic waves therein may further interfere with incident acoustic waves, producing patterns of constructive and destructive interference within the acoustic isolation 106 leading to standing waves 118. Leakage of wave energy from within the respective acoustic isolations 106 may thereby be reduced.

In some embodiments, the acoustic isolation 106 may comprise an acoustic reflector comprising an acoustic Bragg mirror structure. The Bragg mirror structure utilizes acoustic interference and comprises alternating layers of high and low acoustic impedance each layer having a thickness corresponding to a quarter wavelength of an acoustic wave. The acoustic Bragg mirror structure offers efficient reflection of acoustic waves with of a given frequency.

In some other embodiments, the acoustic isolation 106 may comprise an acoustic reflector comprising a material having an acoustic band gap. Materials having an acoustic band gap are made of periodic arrays of material which produce stopbands in which acoustic waves of certain frequencies cannot propagate, analogous to, for instance, Bragg reflection of electrons in solids. Acoustic waves of a given frequencies may thereby be efficiently reflected by the acoustic isolation 106, rather than propagated through the acoustic isolation 106.

In yet some other embodiments, the acoustic isolation 106 may comprise an acoustic reflector comprising an air gap or a vacuum gap. The air gap or vacuum gap provides a large acoustic impedance mismatch whereby acoustic waves may be efficiently reflected by the acoustic isolation 106.

By these arrangements, leakage of wave energy from within the acoustic isolation 106 may be reduced, resulting in that a standing wave 118 may be generated within the acoustic resonator 108 in an efficient manner. The use of a standing wave 118 within the acoustic resonator may further improve the efficiency of the respective above devices 100, 200.

It should be noted that the stacking order of the magnetostrictive film 102 and the deformation layer 104 may be different from the one disclosed in relation to FIG. 1. It will be appreciated, however, that it may be advantageous under some circumstances to have the magnetostrictive film 102 located at a position within the acoustic isolation 106 where the vibration amplitude caused by the alternating attenuation is large, e.g., in the center of the stack of layers 101 for the fundamental mode of the acoustic resonator 108.

By tuning the frequency of the alternating attenuation, the locations at which the increased vibrational amplitudes occur within the acoustic resonator 108 may be tuned. This also holds if the device comprises additional layers. Moreover, higher order harmonics may also result in standing waves 118 within the acoustic resonator 108, shifting the locations of the antinodes in the stack of layers 101, 204.

Figure 3:
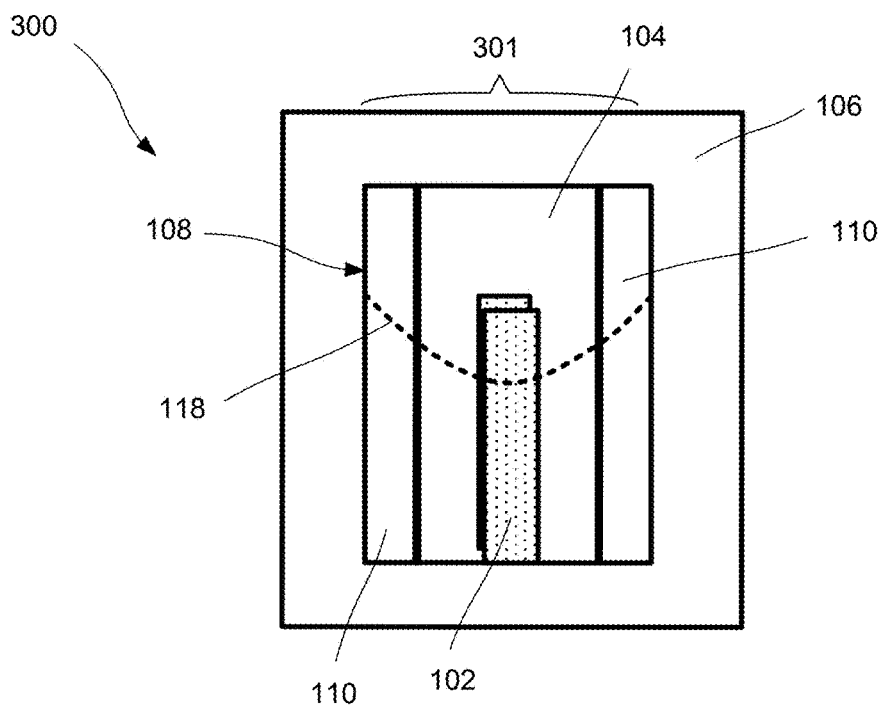
FIG. 3 illustrates a schematic cross-sectional view of yet another device for generating and/or detecting spin waves, according to embodiments.

FIG. 3 illustrates a schematic cross-sectional view of a device 300 for generating and/or detecting spin waves, according to embodiments. The device 300 comprises a plurality of layers 301 arranged adjacent to each other. The stack of layers 301 comprises a magnetostrictive film 102 which is arranged adjacent to, and thereby in mechanical contact with, a deformation film 104. The magnetostrictive film 102 is surrounded by the deformation film 104 and an acoustic isolation 106, such that each of opposing major surfaces of the magnetostrictive film 102 contacts the deformation film. Electrodes 110 are further arranged within the acoustic isolation 106. The electrodes 110 form part of the plurality of layers 301. The electrodes 110 are in contact with the deformation film 104. By this arrangement, a plurality of interfaces is formed between the deformation film 104 and the magnetostrictive material 104 which increases the mechanical interaction between the two layers. A more sensitive device 300 for generating and detecting spin waves may thereby be obtained. The features and benefits of the device 300 are described above in relation to the devices 100 and 200 and reference is given to the description above.

In the description above, according to embodiments, the deformation film 104 comprises one or more piezoelectric materials selected from the group consisting of $PbZrTiO_3$ (PZT) $PbMgNbO_x$—$PbTiO_x$ (PMN-PT), $BaTiO_3$ (BTO), SrBiTaOx (SBT), AlN, GaN, $LiNbO_3$ (LNO), ZnO, (K,Na)$NbO_x$ (KNN), and orthorhombic $HfO_2$.

To this end, according to embodiments, the magnetostrictive material may alternatively comprise a material selected from the group consisting of Galfenol ($Ga_xFe_{1-x}$), Co, Ni, and a Heusler alloy.

The deformation film may alternatively comprise an electro-active material, which is material that exhibit a change in physical dimensions, i.e. size and/or shape, when stimulated by an electric field.

The electro-active material may comprise a polymer such as PTFE, PVC or a dielectric such as for example $SiO_2$, $Ta_2O_5$, $HfO_2$, $Al_2O_3$; or $Si_3N_4$, ITO or a semiconductor material such as SiC, and black Si.

Figure 4:
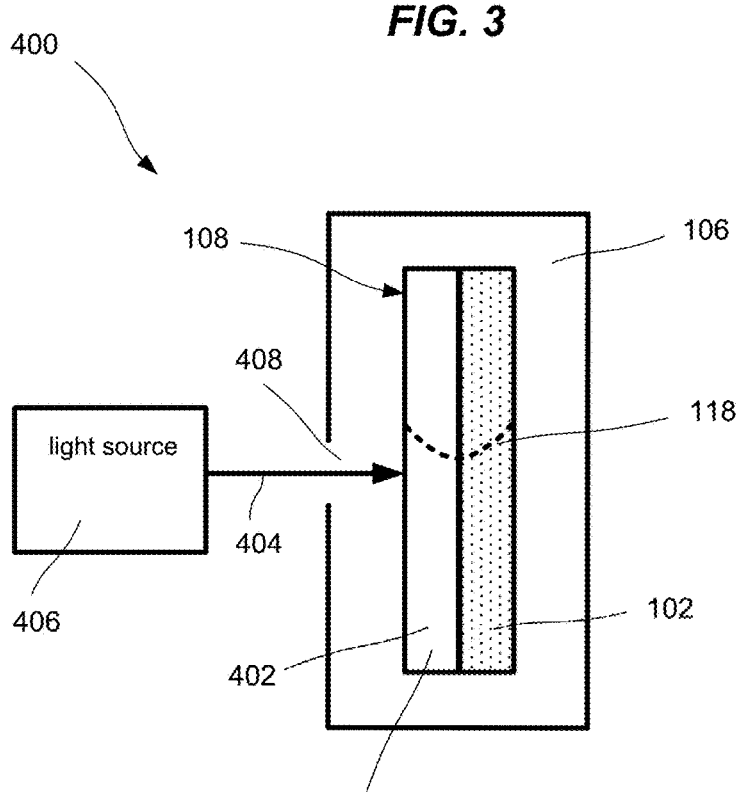
FIG. 4 illustrates a schematic cross-sectional view of a device for generating spin waves, according to embodiments.

The deformation film 104 may alternatively comprise an opto-thermally active material, as illustrated in FIG. 4, according to embodiments. FIG. 4 illustrates a device 400 for generating and/or detecting spin waves. The device 400 comprises an opto-thermally active material 402 and a magnetostrictive film 102 surrounded by an acoustic isolation 106. The opto-thermally active material 402 and the magnetostrictive film 102 are arranged adjacent to each other and are thereby in mechanical contact.

By this arrangement, the device 400 for generating spin waves may be actuated by a light beam 404 from a light source 406 such as a laser or light emitting diode. The light 404 emitted from the light source 406 enters the device 400 through a window 408 and may thereby induce a change in the physical dimensions of the opto-thermally active material 402. The change in dimensions of the opto-thermally active material 402 produces a mechanical stress on the magnetostrictive film 102. The emitted light 404 may be alternated in intensity whereby an alternating actuation of the magnetostrictive film 102 may be obtained. The mechanical stress may thereby change the susceptibility of the magnetostrictive film 102 with a given frequency. The alternating actuation results in a change in magnetization of the magnetostrictive film 102 whereby a spin wave may be generated in the magnetostrictive film 102 as described above. By proper selection of the frequency of the alternating actuation the resonance condition of the acoustic resonator 108 formed by the acoustic isolation 106 may be met leading to an increased vibrational amplitude within the magnetostrictive film 102. This frequency of the alternating actuation an increased mechanical stress in the magnetostrictive film 102 may be obtained resulting in a more efficient change in the magnetization of the magnetostrictive film 102. Hence, a spin wave may more efficiently be generated in the magnetostrictive film 102 and a more efficient device 400 for generating spin waves may be obtained.

The opto-thermally active material may comprise a semiconductor material such as Ge, Si, GaAs, InAs, InP, or amorphous C. The skilled person in the art realizes that other materials may be used to provide the opto-thermally active material, i.e. any material that absorbs light of a given wavelength used for the actuation and increases its physical dimensions when receiving the light.

The acoustic isolation 106 may alternatively be transparent to the light emitted 404 from the light source 406. The light may thereby be transmitted through the acoustic isolation 106 to the opto-thermally active material.

Further, the device for detecting spin waves may be operated by sensing an electrical power generated in the deformation film 104 when using an electro-active material.

The magnetostrictive films 102 described above may act as the spin waveguides. Alternatively, the magnetostrictive films 102 may be in magnetic connection with separate spin waveguides such that spin waves may be transferred between the separate spin waveguides and the magnetostrictive films.

The person skilled in the art further realizes that the present disclosure by no means is limited to the preferred embodiments described above. On the contrary, many modifications and variations are possible within the scope of the appended claims.

Additionally, variations to the disclosed embodiments can be understood and effected by the skilled person in practicing the claimed embodiments from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

What is claimed is:

1. A device configured as one or both of a spin wave generator or a spin wave detector, the device comprising:
   a magnetostrictive film formed of a magnetostrictive material;
   a deformation film physically connected to the magnetostrictive film; and
   an acoustic isolation surrounding the magnetostrictive film and the deformation film to form an acoustic resonator,
   wherein when the device is configured as the spin wave generator, the deformation film is configured to undergo a change in physical dimensions in response to an actuation, wherein the change in the physical dimensions of the deformation film induces a mechanical stress in the magnetostrictive film to cause a change in the magnetization of the magnetostrictive film, and
   wherein when the device is configured as the spin wave detector, the magnetostrictive film is configured to undergo a change in physical dimensions in response to a change in magnetization, wherein the change in the physical dimensions of the magnetostrictive film induces a mechanical stress in the deformation film to cause generation of electrical power by the deformation film; and
   a spin waveguide connected to the magnetostrictive film and configured to propagate spin waves, wherein the spin waveguide is formed of the magnetorestrictive material or a ferromagnetic material different from the magnetorestrictive material.

2. The device according to claim 1, wherein the spin waveguide is formed of the magnetorestrictive material.

3. The device according to claim 2, wherein the spin waveguide is integrally formed with the magnetostrictive film.

4. The device according to claim 3, wherein the magnetostrictive film extends from the inside of the acoustic isolation to the outside of the acoustic isolation through an opening formed through the acoustic isolation.

5. The device according to claim 2, wherein the spin waveguide comprises a separate ferromagnetic element connected to the magnetostrictive film.

6. The device according to claim 5, wherein the separate ferromagnetic element extends from the inside of the acoustic isolation to the outside of the acoustic isolation through an opening formed through the acoustic isolation.

7. The device according to claim 1, further comprising an electrode arranged within the acoustic isolation and in contact with the deformation film.

8. The device according to claim 1, wherein the deformation film comprises a piezoelectric material.

9. The device according to claim 8, wherein the piezoelectric material comprises one or more selected from the group consisting of PbZrTiO3 (PZT), PbMgNbOx-PbTiOx (PMN-PT), BaTiO3 (BTO), SrBiTaOx (SBT), AlN, GaN, LiNbO3 (LNO), ZnO, (K,Na)NbOx (KNN) and orthorhombic $HfO_2$.

10. The device according to claim 1, wherein the deformation film comprises an electro-active material or an opto-thermally active material.

11. The device according to claim 1, wherein the acoustic isolation comprises an acoustic reflector, wherein the acoustic reflector comprises an acoustic Bragg mirror structure, a material having an acoustic band gap, an air gap, a vacuum gap or a difference in acoustic impedance.

12. The device according claim 1, wherein the magnetostrictive material comprises one or more selected from the group consisting of Terfenol-D (TbxDy1−xFe2), Galfenol (GaxFe1−x, Co), Ni, and a Heusler alloy.

13. The device according to claim 1, wherein the magnetostrictive film has major surfaces facing away from each other, wherein each major surface contacts the deformation film.

14. The device according to claim 1, further comprising a first electrode and a second electrode, wherein the deformation film and the magnetorestrictive film are interposed between the first electrode and the second electrode in a vertical direction crossing major surfaces of the deformation film and the magnetorestrictive film.

15. The device according to claim 14, wherein the first electrode contacts the deformation film and the second electrode contacts the magnetorestrictive film, such that the first electrode, the deformation film, the magnetorestrictive film and the second electrode form a stack inside the acoustic isolation.

16. A method of generating spin waves, the method comprising:
    providing an alternating actuation to a deformation film physically connected to a magnetostrictive film formed of a magnetostrictive material, wherein the deformation film and the magnetostrictive film are surrounded by an acoustic isolation to form an acoustic resonator, and wherein the magnetostrictive film is connected to a spin waveguide configured to propagate spin waves, wherein the spin waveguide is formed of the magnetostrictive material or a ferromagnetic material different from the magnetostrictive material,
    wherein the alternating actuation changes physical dimensions of the deformation film,
    wherein the alternating actuation has a frequency arranged to excite a resonance of the acoustic resonator, thereby creating a standing acoustic wave within the acoustic isolation, the standing wave inducing a mechanical stress in the magnetostrictive film resulting in a change in magnetization of the magnetostrictive film, such that a spin wave is generated in the magnetostrictive film.

17. The method according to claim 16, wherein the frequency of the alternating actuation is between 1 GHz and 100 GHz.

18. The method according to claim 16, wherein the alternating actuation is an alternating electrical power.

19. The method according to claim 16, wherein the alternating actuation is a light beam alternating in intensity.

20. A method for detecting spin waves, comprising:

receiving a spin wave in the magnetostrictive film formed of a magnetostrictive material, the magnetostrictive film being physically connected to a deformation film, wherein the deformation film and the magnetostrictive film are surrounded by an acoustic isolation to form an acoustic resonator, wherein the magnetostrictive film is connected to a spin waveguide configured to propagate spin waves, wherein the spin waveguide is formed of the magnetostrictive material or a ferromagnetic material different from the magnetostrictive material, and wherein receiving the spin wave causes a change of magnetization of the magnetostrictive film, thereby changing the physical dimensions of the magnetostrictive film, resulting in a mechanical stress in the deformation film such that an electrical power is generated in the deformation film.

* * * * *

UNITED STATES PATENT AND TRADEMARK OFFICE
CERTIFICATE OF CORRECTION

PATENT NO. : 10,211,809 B2
APPLICATION NO. : 15/143228
DATED : February 19, 2019
INVENTOR(S) : Xavier Rottenberg Page 1 of 2

It is certified that error appears in the above-identified patent and that said Letters Patent is hereby corrected as shown below:

On the Title Page

Item (57), Abstract, Line 6-7, change "magnetorestrictive" to --magnetostrictive--.

In the Drawings

Sheet 3 of 3 (FIG. 6), Line 2 (Reference Numeral 602), change "magnetorestrictive" to --magnetostrictive--.

In the Specification

Column 1, Line 24, change "miniturization," to --miniaturization,--.

Column 1, Line 29 (approx.), change "miniturization" to --miniaturization--.

Column 1, Line 35 (approx.), change "miniturization" to --miniaturization--.

Column 5, Line 64, change "magnetorestriction" to --magnetostriction--.

In the Claims

Column 12, Line 9 (approx.), in Claim 1, change "magnetorestrictive" to --magnetostrictive--.

Column 12, Line 11 (approx.), in Claim 1, change "magnetorestrictive" to --magnetostrictive--.

Column 12, Line 13 (approx.), in Claim 2, change "magnetorestrictive" to --magnetostrictive--.

Column 12, Line 48, in Claim 12, after "according" insert --to--.

Column 12, Line 58, in Claim 14, change "magnetorestrictive" to --magnetostrictive--.

Signed and Sealed this
Eleventh Day of June, 2019

Andrei Iancu
*Director of the United States Patent and Trademark Office*

CERTIFICATE OF CORRECTION (continued)
U.S. Pat. No. 10,211,809 B2

Column 12, Line 61, in Claim 14, change "magnetorestrictive" to --magnetostrictive--.

Column 12, Line 64, in Claim 15, change "magnetorestrictive" to --magnetostrictive--.

Column 12, Line 65, in Claim 15, change "magnetorestrictive" to --magnetostrictive--.